United States Patent [19]

Ketchen

[11] Patent Number: 4,588,947

[45] Date of Patent: May 13, 1986

[54] INTEGRATED MINIATURE DC SQUID SUSCEPTOMETER FOR MEASURING PROPERTIES OF VERY SMALL SAMPLES

[75] Inventor: Mark B. Ketchen, Ossining, N.Y.

[73] Assignee: International Business Machines Corporation, Armonk, N.Y.

[21] Appl. No.: 567,302

[22] Filed: Dec. 30, 1983

[51] Int. Cl.$^4$ .................... G01R 33/16; G01R 33/035
[52] U.S. Cl. .................... 324/201; 307/306; 324/248; 357/5
[58] Field of Search ........ 324/248, 201, 235, 239–243; 307/306; 323/360; 335/216; 336/DIG. 1; 357/5

[56] References Cited

U.S. PATENT DOCUMENTS 4,320,341 3/1982 Lutes .................................. 324/248
4,389,612 6/1983 Simmonds et al. ................. 324/248

OTHER PUBLICATIONS

McLachlan et al, "Detection Method for the ... Phase Transition of 10$\mu$ Spheres, *Rev. Sci. Inst.*, vol. 39, No. 9, Sep. 1968 pp. 1340–1342.
Drukier et al, Transition Radiation Effects in Superconducting Granules *Lettre al Nuevo Cimento*, vol. 14, No. 8, Oct. 25, 1975, pp. 300–304.
Hu et al, Experiments on Ge-Sn Barrier Josephson Junctions, *IEEE Transactions on Magnetics*, vol. MAG-15, No. 1, Jan. 1979, pp. 585–588.
Ketchen et al, An Ultra-Low-Noise Tunnel Junction dc SQUID, *Appl. Phys. Lett.* 35(10), Nov. 15, 1979, pp. 81–84.
Clarke, John, Advances in SQUID Magnetometers, *IEEE Trans. on Electron Devices*, vol. ED-27, No. 10, Oct. 1980, pp. 1898–1908.
Ketchen et al, "Ultra-Low-Noise ... dc SQUID with ... Planar Input Coil" *Appl. Phys. Lett.* 40(8), Apr. 15, 1982, pp. 736–738.
de Wall et al, Low Noise Niobium dc SQUID with a Planar Input Coil *Appl. Phys. Lett.* 42(4), Feb. 15, 1983, pp. 389–391.
Muhlfelder et al, Double Transformer Coupling to a Very Low Noise SQUID, IEEE Trans. on Magnetics, vol. MAG-19, No. 3, May 1983, pp. 303–307.
Voss et al, Niobium Nanobridge d.c. SQUID, *Appl. Phys. Lett.* 37(7), Oct. 1, 1980, pp. 656–658.
Cromar et al, Low–Noise Tunnel Junction dc SQUID'S, *Appl. Phys. Lett.*, 38(9), May 1, 1981, pp. 723–725.
Ketchen et al, Superconducting Thin–Film Gradiometer, *J. Appl. Phys.* 49(7), Jul. 1978, pp. 4111–4116.
Van Harlingen et al, "Superconducting ... Device with Very Low Magnetic Flux Noise Energy, Appl. Phys. Lett. 41(2) Jul. 15, 1982, pp. 197–199.

*Primary Examiner*—Gerard R. Strecker
*Attorney, Agent, or Firm*—Jackson E. Stanland

[57] ABSTRACT

A miniature, fully integrated susceptometer capable of measuring the magnetic properties of very small samples (<10 $\mu$m) is described which is fabricated by thin film lithography on a single chip. The susceptometer is comprised of a dc SQUID including two series wired pick-up loops into which a sample to be measured can be placed. A field coil is provided which includes a separate single turn around each of the SQUID pick-up loops. The SQUID pick-up loops and the surrounding field coil turns are both located over a hole in a superconducting groundplane. The SQUID pick-up loops are connected by wide, low inductance transmission lines to remotely located Josephson tunnel junctions. The signal to be detected is generated locally within one of the SQUID pick-up loops to provide direct coupling of the sample to be measured to the SQUID pick-up loop. The SQUID tunnel junctions are remotely located from the pick-up loops and are located over a superconducting groundplane. A resistive balance circuit is provided, as is readout electronics for detecting the state of the SQUID.

21 Claims, 3 Drawing Figures

INTEGRATED MINIATURE DC SQUID SUSCEPTOMETER FOR MEASURING PROPERTIES OF VERY SMALL SAMPLES

FIELD OF THE INVENTION

This invention relates to a new, very sensitive dc SQUID instrument for measuring the magnetic properties of small particles and thin film samples at cryogenic temperatures, and more particularly to such an instrument employing small area junctions in the SQUID and small pick-up loops, all of which are integrated in a planar structure on the same substrate and wherein the scale for the sample size is set by the same parameters that limit the size of the superconducting tunnel junctions in the SQUID.

BACKGROUND ART

Superconducting quantum interference devices, known as SQUIDs, have been developed and applied to many problems in physics, earth science and biology. These are highly sensitive static detectors of magnetic flux which can be built to have intrinsic energy sensitivities approaching the quantum limit. Examples of SQUID devices being used as gradiometers, magnetometers, and galvanometers is found in an article by M. B. Ketchen et al, J. Appl. Phys. 49, 7, page 4111, July 1978 and in J. Clarke, IEEE Trans. on Electron Devices, Vol. ED-27, p. 1896 (1980) and J. Clarke, "Superconducting Applications: Squids and Machines", edited by B. B. Schwartz and F. Foner, Plenum Press, N.Y. 1977.

In the gradiometer of Ketchen et al, two pick-up loops are used together with a SQUID, the loops and the SQUID being made of thin films deposited on a planar substrate. Typically an input coil is used to couple the signal from the pick-up loop to the SQUID to allow shielding of the SQUID functions from the external magnetic field. Both RF and dc SQUIDs have been applied to magnetometry. The RF SQUID is equivalent to a superconducting ring having a single weak link or Josephson tunnel device coupled to a resonant circuit driven by a constant current source at a selected RF frequency. Both the Q-factor and the resonant frequency of the circuit are modified by the coupling to the SQUID depending on the magnetic flux through the ring. On the other hand, a dc SQUID is one in which a superconducting loop incorporates multiple junctions, for example, two Josephson junctions, in parallel. For this type of SQUID, the maximum supercurrent across the device, the critical current, is a periodic function of the magnetic flux enclosed in the loop. Dc SQUIDs are usually operated in a resistive mode at constant current in which the total current is due in part to superconducting electrons and in part to normal electrons. A voltage signal is then picked off a convenient operating point of the corresponding current-voltage curve. Changes in this voltage are a function of changes in the magnetic flux contained within the loop.

In recent years, a number of workers have reported planar dc SQUIDs with improved intrinsic energy sensitivities, ultimately approaching the quantum limit. For example, reference is made to the following articles:
1. E. L. Hu et al, IEEE Trans. Magn., Mag-15, 585 (1974)
2. M. B. Ketchen et al, Appl. Phys. Lett., 35, 812 (1979)
3. R. F. Voss et al, Appl. Phys. Lett., 37, 656 (1980)
4. M. W. Cromar et al, Appl. Phys. Lett., 38, 723 (1981)
5. D. J. vanHarlingen et al, Appl. Phys. Lett., 41, 197 (1982)

Planar coupling schemes have also been introduced to provide more efficient coupling of high resolution SQUIDs to input circuits having useful inductances of the order of 1 $\mu$H. Representative examples of these planar coupling schemes include the following references:
1. M. B. Ketchen et al, Appl. Phys. Lett., 40, 736 (1982)
2. D. J. deWall et al, Appl. Fhys. Lett., 42, (1983)
3. B. Muhlfelder et al, IEEE Trans. Magn., MAG-19, 303 (1983)

Applications envisioned for this new generation of SQUIDs have tended to involve making more sensitive instruments of the variety already in use now for a number of years. That is, dc SQUIDs having small size and high sensitivity are made, and can be substituted into instruments such as the susceptometer manufactured by S. H. E. Corporation of San Diego, Calif. These commercial susceptometers are used to measure samples having typical dimensions of approximately 1 cm. Sensitivites on the order of $10^{-8}$ emu over a temperature range of 4.2° K. to 400° K. can be achieved with magnetic fields of up to 50 kG.

Such commercial susceptometers consist of a roughly balanced wire wound gradiometer (no low temperature balance adjustment) connected to an approximately 2 $\mu$H input coil of a conventional RF SQUID. Static ambient fields of up to approximately 50 kG are applied with a superconducting solenoid magnet. The magnetic field is turned on with the gradiometer coils driven normal by a heater. With the field at the desired value, the heater is turned off, trapping some flux but no current in the gradiometer pick-up loops/input coil circiut. The RF SQUID, in the meantime, is highly shielded from the applied magnetic field. The field coil gradiometer pick-up loops are all within a large superconducting shield for electrical isolation. The sample to be measured is periodically (every few seconds to a minute) moved into and out of one of the gradiometer pick-up loops. The amplitude of the signal registered by the SQUID is proportional to the susceptibility of the sample. The sample chamber is thermally isolated from the cryogenic environment so that the sample temperature can be varied over a wide range. The roughly balanced gradiometer pick-up coil configuration helps with noise rejection, although in a more highly shielded environment a straight magnetometer arrangement would work equally well.

In many applications in physics, it is desirable to be able to look at the magnetic properties of small particle sizes in fields of 0-30 G. Such instruments require extremely small junctions in the dc SQUID in order to have enhanced sensitivity of the SQUID, and extremely small pick-up loops to allow good coupling to the sample. Further, the fluctuation of certain parameters, such as temperature, scales inversely with volume. The ability to study small samples makes possible the measurement of fluctuation and noise effects that are averaged out and undetectable in larger samples.

To precisely examine the physical properties of certain materials very small samples are required. If large area samples are used, essential features can become averaged and the measured values are not truly representative of the actual values. In the case of thin film samples, these are particularly hard to measure because of the geometry effects that occur to cloud the meaning of the data that is obtained. Of course, it is also difficult to make a truly homogeneous film over large dimensions, and for this additional reason it is desirable to be able to precisely examine very small particles and films.

Another area in which accurate investigation of small particles and films is required is where larger samples are unavailable. For example, single crystals of materials that exhibit both superconductivity and ferromagnetism cannot be made in large samples. For these materials, it is necessary to look at a single crystal to investigate the material in order to separate out what behavior is truly intrinsic to an individual crystal as opposed to behavior resulting from interactions at grain boundaries. The instrument described here is ideally suited for the study of such samples including an investigation of crystal size efforts that may become evident as dimensions are decreased to on the order of small characteristic lengths characterizing internal interactions within the material.

Accordingly, it is an object of this invention to provide a SQUID susceptometer which is miniature and integrated on a single chip, and which is ideally suited for the study of magnetic properties of small particles and thin film samples at cryogenic temperatures.

It is another object of the present invention to provide a SQUID susceptometer which has increased sensitivity over presently available small particle susceptometers.

The use of small wire-wound coils and conventional electronics to measure the susceptibility changes of small particles going through their superconducting transition is described in the following references, both of which describe instruments that are several orders of magnitude less sensitive than the present instrument. They are:
1. D. S. McLachlan et al, Rev. Sci. Inst., 39, 1340 (1968)
2. A. K. Drukier et al, Lettre al Nuovo Cimento, 14, 300 (1975)

It is another object of the present invention to provide a novel miniature SQUID susceptometer which is a broad band instrument that will allow the measurement of magnetic noise spectra as well as the measurement of temperature dependent susceptibilities.

It is another object of the present invention to provide a miniature SQUID susceptometer capable of measuring extremely small samples and in which inductance values are significantly reduced over those encountered in commercial SQUID susceptometers.

It is another object of the present invention to provide a miniature SQUID susceptometer having extremely small sizes integrated in a planar fashion on a single chip, and in which the dimensions of both the junctions of the SQUID and the coils in the instrument are limited only by the lithography used to produce the instrument.

It is another object of the present invention to provide a miniature SQUID susceptometer in which the scale for the size of the sample being investigated is set by the same lithography that limits the size of the junctions in the SQUID.

It is another object of the present invention to provide a miniature SQUID susceptometer integrated on a single chip in which the dimensions of all components of the SQUID instrument are very small and in which all components are fabricated by planar lithography techniques on a single chip, and wherein the same lithography techniques can be used to deposit the sample to be measured by the instrument.

DISCLOSURE OF THE INVENTION

This miniature, integrated susceptometer includes pick-up loops which are part of the SQUID loop and which are located in the high magnetic field region of the instrument. The Josephson elements (junctions, weak links, etc.) of the SQUID are planar, as are the pick-up loops and the field coil loops used to apply a magnetic field to a sample located within the pick-up loops. In contrast with other SQUID susceptometers, the signal to be measured is generated locally within the pick-up loop forming a portion of the SQUID, where there is direct coupling of the sample to the SQUID loop. The size of the sample can range from slightly smaller than the loop size down to $\sim 1000$Å or possibly less.

In one embodiment, the dc SQUID is comprised of two series wired (square) pick-up loops that are wound in opposite sense over a hole in a superconducting ground plane. These pick-up loops (comprising a portion of the SQUID) are connected by wide, low inductance transmission lines to remotely located Josephson elements such as Josephson tunnel junctions or weak links. The Josephson elements are nonhysteretic and are typically shunted with a parallel shunt resistance.

A field coil is provided for producing a magnetic field which intercepts the pick-up loops of the SQUID. A center tapped field coil takes a single (square) turn around each pick-up loop of the SQUID. An adjustable constant current source is provided across the terminals of the field coil, and a modulation current source is provided to produce a current through one turn of the field coil to optimally flux-bias the SQUID.

A bias current source is provided across the SQUID for dc biasing the Josephson elements of the SQUID to a proper operating point. Readout electronics can also be connected to the SQUID loop in order to read out the SQUID. The readout electronics can be comprised of conventional devices such as RF SQUIDs and FET readout circuits.

These and other objects, features, and advantages will be apparent from the following more particular description of the preferred embodiments.

BEST MODE FOR CARRYING OUT THE INVENTION

Figure 1:
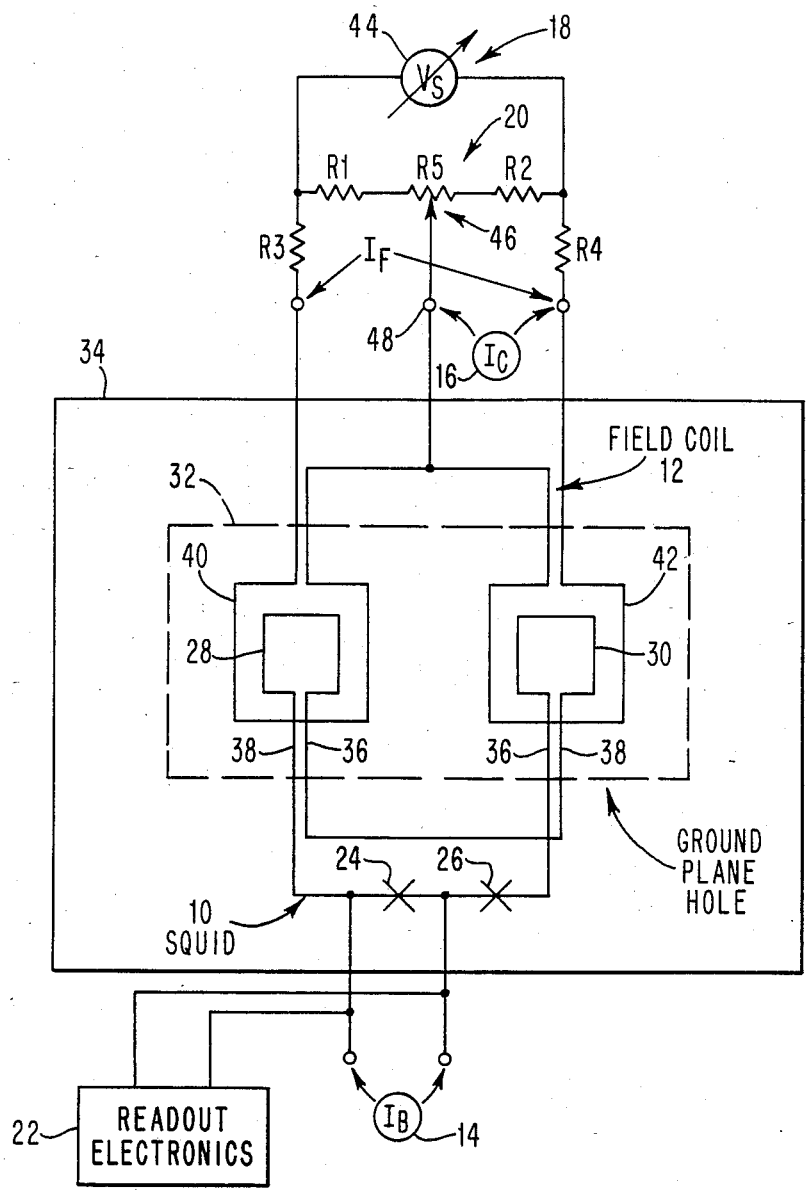
FIG. 1 is a schematic diagram illustrating the electrical circuitry of the present miniature susceptometer.

The miniature SQUID susceptometer of this invention is one which is integrated on a single substrate chip, all components of which are produced by planar lithographic techniques, and is designed for a single purpose: the measurement of properties of extremely small particles and thin films. It is generally comprised of a dc SQUID (where the pick-up loops of the susceptometer are portions of the SQUID loop) and a center-tapped field coil having a single turn around each of the SQUID pick-up loops.

In contrast with prior SQUID susceptometers the loop portion of the dc SQUID is located in the high field region of the susceptometer, and the sample to be investigated produces a signal which is generated locally within one of the pick-up loops of the SQUID, so that the sample couples directly to the SQUID loop inductance. In all other known types of SQUID susceptometers, the signal is either transferred to the SQUID loop by an input circuit or the signal is generated externally and the SQUID is brought to the environment of the signal.

Another key feature of this susceptometer is that the scale for the sample size is set by the pick-up loop size, which in turn is set by photolithographic considerations. Thus, the pick-up loops can be made very small and the range of sample size even smaller. The small, low inductance pick-up loops couple well to small samples. Additionally, the SQUID tunnel junctions can be made of extremely small size (again limited by photolithographic considerations) to enhance the intrinsic energy sensitivity.

With these features in mind, the SQUID susceptomer of FIG. 1 will now be described. The susceptometer is generally comprised of a dc SQUID 10, a field coil 12, means 14 for providing a bias current $I_B$ to the SQUID 10, means 16 for providing a modulation current to the field coil 12, means 18 for providing the field current $I_f$ to the field coil 12, and a balance network 20 for applying current to the field coil 12 in order to balance out system asymmetries. SQUID read-out electronics 22 are also provided for detecting the state of the SQUID, which is an indication of the properties of the sample being investigated. Conventional read-out electronics can be used, such as a RF SQUID circuit of the type shown in M. B. Ketchen and J. M. Jaycox, Appl. Phys. Lett., 40, 736 (1982), and M. B. Ketchen and C. C. Tsuei in SQUID '80, edited by H. -D. H. Hahlbohm and H. Lubbig (Walter deGiruyter, Berlin, New York 1980) p. 227. Another known readout scheme uses FET devices which can be at room temperature.

Dc SQUID 10 includes two Josephson elements 24 and 26 in a superconducting loop including two series-wired square pick-up loops 28 and 30 wound in opposite electrical sense over a hole 32 in the superconducting ground plane 34. Loops 28 and 30 are connected by wide, low inductance transmission lines 36 and 38 to minimize the inductance of the dc SQUID 10. The Josephson elements 24 and 26 are preferably Josephson tunnel junctions, such as edge junctions or planar junctions. However, other types of Josephson elements, such as weak links, can be used. Junctions 24 and 26 are non-hysteretic and generally have this characteristic due to a parallel shunt resistance across each of the junctions 24 and 26. These techniques are well known in the art.

Superconducting Josephson junctions 24 and 26 are located over the ground plane in order to provide shielding from the magnetic fields due to currents in the field coils 12 and from samples placed within the pick-up loops 28 and 30. As noted previously, the pick-up loops 28 and 30 are portions of the SQUID 10 and are located over a hole in the ground plane. This means that they will be located in a high field region of the susceptometer, in contrast with prior designs where the entire SQUID was located in a shielded region.

The field coil 12 is a center tapped coil which includes a single turn 40 around pick-up loop 28 and another single turn 42 around pick-up loop 30. A field current $I_f$ is produced by the field current source 18, including a variable voltage source 44 and the resistors R1, R2, R3, R4, and R5. While dc currents are typically applied to the field coil, ac currents can be applied if the voltage source 44 is an ac voltage source.

The resistive balancing network 20 uses the adjustable center tap 46 to balance out system asymmetries, such as those which occur because of the cross-over of the transmission lines 36 and 38 used to provide the opposite sense windings of pick-up loops 28 and 30.

Another part of the imbalance is associated with direct coupling between the field coil leads and the pick-up loops 28 and 30. The balance of the susceptometer is easily adjusted electrically by the resistive network 20 that utilizes the center tap 48 of the field coil 12.

Although a dc current $I_f$ is often used in the field coil 12, it was mentioned that voltage source 44 can be an ac source so that the field coil 12 can be driven at frequencies greater than 1 kHz in order to minimize the effects of 1/f noise. Existing RF SQUIDs or FET readout schemes with dynamic ranges of $\gtrsim 10^4$ will be completely adequate to read out the dc SQUID 10.

The operation of SQUID susceptometers is well known in the art and will not be described in detail here. It should be understood that the instrument depicted in FIG. 1 can be used for the measurement of many properties of very small samples and can be used in many different applications, including measurement of sample properties and other applications, such as biological studies, if very close coupling (of the order of the pickup loop diameter) can be obtained between the pick-up loop and the biological cell to be examined. The precise application and mode of operation of the instrument of FIG. 1 is not a critical part of this invention, it being understood that those of skill in the art will utilize this highly sensitive instrument to advantage in many different applications, and in many different ways.

In the design where the sample is located on the superconducting chip, the temperature range of operation is limited on the high side to the temperature where the SQUID will not function (i.e., will go normal) and on the low side to the temperature at which the resistive shunts may go superconducting. However, it is within the skill of the art to use a fixture which thermally isolates the sample from the SQUID, where the fixture is brought very close to the SQUID to couple the sample to the SQUID. When this type of thermal isolation is used, the temperature range over which sample properties can be measured is increased greatly. A representative mode of operation for the instrument of FIG. 1 is the following: The susceptometer is typically mounted on a ceramic header. The contact pads are connected to header pins and the header is plugged into a receptacle that is wired into the readout electronics, such as a RF SQUID preamplifier circuit. The SQUID is biased with current $I_B$ and a flux $MI_c$ where the modulation current $I_c$ is applied to one turn 42 of the field coil 12. Source 14 ($I_B$) sets the current through the Josephson elements, and source 16 ($I_c$) sets the magnetic flux through the pick-up loop 30 to adjust the flux bias.

With the susceptometer in liquid helium, a current $I_f$ can be passed through field coil 12. This produces a magnetic field in the center of the pick-up loops 28 and 30. The susceptometer is then balanced using the resistive balance network 20 to compensate for asymmetry in the design associated with the opposite sense configuration of the pick-up loops 28 and 30, and the direct coupling that occurs between the field coil leads and the pick-up loops 28 and 30.

With the susceptometer balanced, the application of current $I_F$ couples no net flux to the SQUID, since the pick-up loops 28 and 30 are wound in the opposite sense. When a magnetic particle is placed or deposited within one of the SQUID pick-up loops 28 or 30, the field applied to that pick-up loop will be distorted and an imbalance signal will be observed upon application of the current $I_F$. In order to estimate the expected signal magnitude, the simplified geometry of FIG. 3 will be discussed later. Additionally, specific design examples will be described.

In the operation of the susceptometer of FIG. 1, thin film samples can be mounted by direct deposition onto the susceptometer substrate. A discrete small particle, on the other hand, needs to be physically placed in a pick-up loop 28 or 30 and kept there. Among other applications, this instrument can be used at cryogenic temperatures for the study of temperature dependent susceptibility as well as magnetic noise in thin film samples and for the study of discrete particles having volumes in the range of $10^3$ $\mu m^2$ to less than $10^{-3}$ $\mu m^3$. Measurements on small particles are generally made using a vacuum can cryoinsert in which the header holding the susceptometer chip (FIG. 1) is mounted horizontally on a copper block. The chip is thermally grounded to the copper block, which has a time constant of approximately 100 sec. to the helium bath. The bath is stabilized, for example, below 20° K. with an electronic bath stabilizer and the temperature of the copper block is varied by means of a multifilar wound dc heater. If the sample chamber is not thermally isolated from the cryogenic environment, the sample temperature can be varied from the bath temperature up to the maximum operating temperature of the SQUID. However, if the sample is thermally isolated from the SQUID, its temperature could be varied over a much wider range, as noted previously.

FIG. 2

Figure 2:
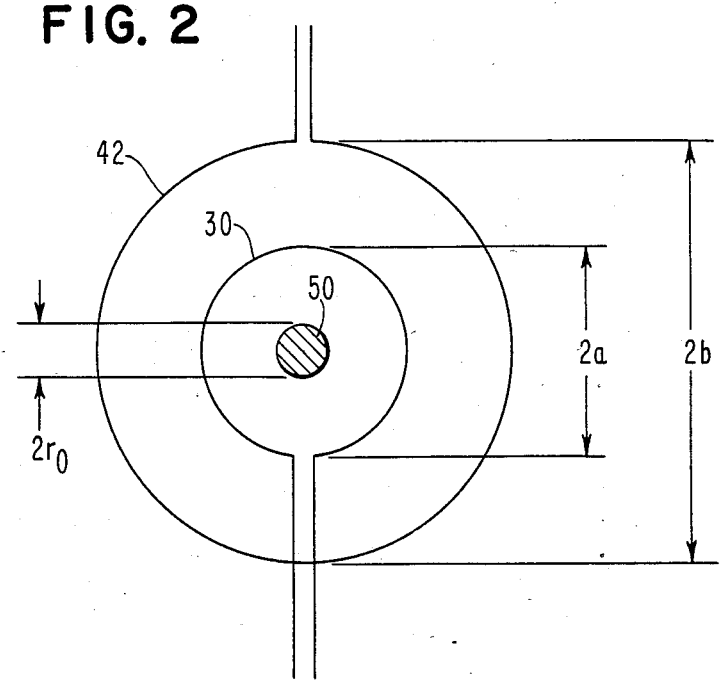
FIG. 2 is a schematic illustration of a portion of the susceptometer, showing a simplified geometry in which a field loop surrounds a pick-up loop in which is located a sample to be measured.

FIG. 2 is a simplified sample particle-loop geometry used to calculate the susceptometer response to the presence of the sample in one of the pick-up loops 28 or 30. In this FIG., it is assumed that the sample 50 to be investigated is a spherical particle of radius $r_O$ at the center of the SQUID pick-up loop 30 and the field loop 42. SQUID loop 30 and field loop 42 are approximated by circular loops in FIG. 2, to aid the mathematical analysis. Circular pick-up loop 30 has a diameter $2a$ and is completely surrounded by the field loop 42 of diameter $2b$.

A current $I_F$ through the field coil generates a magnetic field B at the particle 50. This field includes a dipole moment in the sphere resulting in a change of flux $\Delta\phi$ through the pick-up loop 30 over what would have been there in the absence of the particle. It can be shown that continuity of the component of $\mu/B$ parallel to the surface of the sphere and continuity of the component of B perpendicular to the surface of the sphere lead to $$\Delta\phi = 2\pi B \left( \frac{\mu - \mu_o}{2\mu_o + \mu} \right) \left( \frac{r_o^3}{a} \right) \quad 1$$

where $\mu$ is the magnetic permeability of the particle and $\mu_o$ is the magnetic permeability of free space. The magnetic field at the particle is given by $B = \mu_o I_F/2b$. The change in the mutual inductance $\Delta M$ between the loops associated with the presence of the particle is given by $$\Delta M = \frac{\Delta\phi}{I_F} = \mu_o \pi \left( \frac{\mu - \mu_o}{2\mu + \mu} \right) \left( \frac{r_o^3}{ab} \right) \quad 2$$

The mutual inductance itself is given by $$M = \frac{\phi}{I_F} = \frac{k\mu_o \pi a^2}{2b} \quad 3$$

where $k = 1$ for $a << b$ and $k$ increases to $\sim 1.1$ for $b/a = 2$. Dividing Eq. (2) by Eq. (3) gives $$\frac{\Delta M}{M} = \frac{\Delta\phi}{\phi} = k^{-1} \left( \frac{\mu - \mu_o}{\mu_o + \mu/2} \right) \left( \frac{r_o}{a} \right)^3 = \quad 4$$

$$k^{-1} \left( \frac{2X_m}{3 + X_m} \right) \left( \frac{r_o}{a} \right)^3$$

where the magnetic susceptibility $X_m$ is related to $\mu$ by $\mu = (1 + X_m)\mu_o$. The factor $$k^{-1} \left( \frac{r_o}{a} \right)^2$$

is the fraction of the flux applied to the pick-up loop that is intercepted by the cross section of the particle. For a diamagnetic particle, $$\left( \frac{-2X_m}{3 + X_m} \right)$$

is the fraction of the intercepted flux that is diverted outside the particle. The remaining factor of $(r_o/a)$ is the fraction of the flux diverted outside the particle that is also deflected outside the pick-up loop 30 as derived from the integration of the induced dipole field. In general, the form of Eq. (4) will vary somewhat as the geometry of the particle is varied. For the special case of a small particle with $|X_m| << 1$, Eq. (4) will continue to hold for an arbitrary shaped particle with $(r_o/a)^3$ replaced by the ratio of the particle volume to $4\pi a^3$. For a square pick-up loop (as in FIG. 1) Eq. (4) remains a good approximation if a is replaced with $\sqrt{4/\pi}$ s, where 2s is the length of the side of the pick-up loop. The perturbation associated with displacing the particle from the center of the loop will be second order in the displacement.

To a good approximation the fractional deviation $\delta$ from Eq. (4) for $b/a \approx 2$ is given by $$\delta \approx 0.8 \left( \frac{x_1}{a} \right)^2 - 1.9 \left( \frac{x_2}{a} \right)^2 \quad 5$$

where $x_1$ is the displacement in the plane of the pick-up loop from the center location and $x_2$ is the displacement perpendicular to the plane.

FIG. 3

Figure 3:
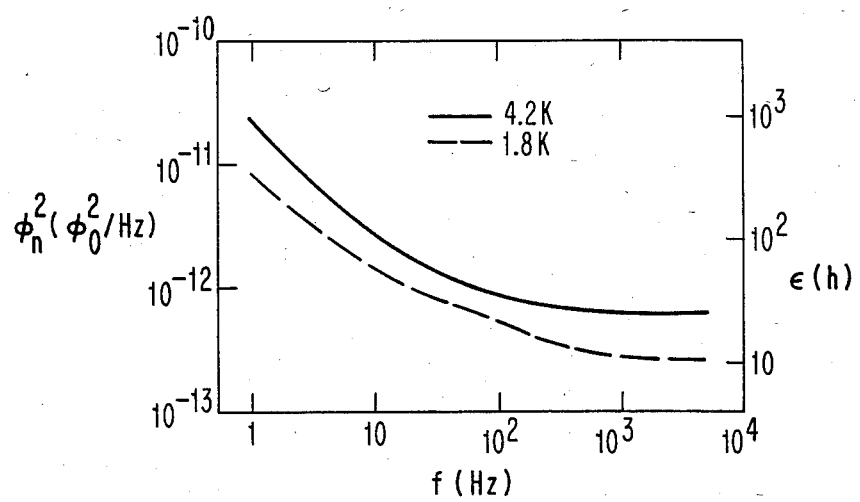
FIG. 3 is a plot of flux noise $\phi_n^2$ and intrinsic energy sensitivity $\epsilon$ as a function of frequency f at 4.2° K. and 1.8° K.

FIG. 3 shows the noise power spectra measured at 4.2° K. and 1.8° K. for a susceptometer chip as shown in FIG. 1, of a particular design dimension. In this design, a 2.5 μm minimum linewidth, 12 level, thin film fabrication process developed for digital circuits was used to fabricate the chip. This process was an enhanced edge-junction version of that described by J. H. Greiner et al in IBM J. Res. Dev. 24, p. 195 (1980). The tunnel junctions 24 and 26 were 2.5 μm long Nb—Nb $O_x$—Pb edge junctions, each of which has a critical current $I_o$ of about 15 μA and a parallel shunt resistance R of approximately 3 ohm. The Junctions were non-hysteretic with a hysteresis parameter $\beta_c$ of approximately 0.1. Each pick-up loop 28, 30 was 17.5 μm across and had an inductance of approximately 30 pH. The interconnection and parasitic inductances totaled about 20 pH, leading to a SQUID inductance L of approximately 80 pH and a modulation parameter $\beta = 2LI_o/\phi_o$ of approximately 1.3, where $\phi_o$ is the flux quantum. The mutual inductance between an individual pick-up loop and the corresponding turn of the field coil (37.5 μm across) was 10.4 pH.

For testing, a 6.35×6.35 mm² susceptometer chip was mounted on a ceramic header. The contact pads were connected to copper header pins with 25 μm diameter Al wire, via ultrasonic bonds. The header was plugged into a receptacle that was wired into a RF SQUID preamplifier circuit that had a typical noise temperature of well under 1° K. The SQUID was biased with a current $I_B$ and a flux $MI_c$, where the modulation current $I_c$ is applied to one turn of the field coil. The repesentative noise power spectra measured at 4.2° K. and 1.8° K. (no preamplifier background subtracted) are shown in FIG. 3. At 4.2° K., the flux noise $\phi_n^2$ takes on a minimum value of $7 \times 10^{-13}$ $\phi_o^2$/Hz and a corresponding intrinsic energy sensitivity $\epsilon$ of 27 h. The white noise scales with temperature and is in good agreement with the theoretical prediction of $$\epsilon = \frac{\phi_n^2}{2L} = \gamma \left( \frac{K_B T}{e I_o R} \right) h \qquad 6$$

for $\gamma \approx 3.4$.

The increased noise at low frequencies (f ≲ 200 Hz) is similar to that of previous SQUIDs with comparable white noise and having planar Pb—$PbO_x$—Pb tunnel junctions (see M. B. Ketchen and J. M. Jaycox, ibid). The low value of $\beta_c$ gives smooth, well-behaved voltage versus flux characteristics. Typically $\phi_n$ in the white noise region is less than $10^{-6}$ $\phi_o/\sqrt{Hz}$ over a range of modulation flux ≳0.05 $\phi_o$ and less than $1.4 \times 10^{-6}$ $\phi_o/\sqrt{Hz}$ over a range ≳0.1 $\phi_o$.

With the susceptometer in liquid helium, a current $I_F$ of up to 100 mA can be passed through the field coil before thermal runaway occurs as a result of lead heating. In a vacuum can with the chip thermally grounded this limit is reached at $I_F$ of approximately 50 mA. The noise spectra are not degraded as $I_F$ is increased from 0 to 15 mA, which corresponds to a magnetic field of 5G at the center of the pick-up loops (a flux $\phi$ of 75 $\phi_o$ is applied to each loop). As $I_F$ is increased further, a noise component of unknown low temperature origin having a form $f^{-0.4}$ emerges. With $I_F = 100$ μA, the noise at 5 kHz increases to $1.2 \times 10^{-6} \phi_o/\sqrt{Hz}$ at 4.2° K. and $9 \times 10^{-7}$ $\phi_o/\sqrt{Hz}$ at 1.8° K.

For this particular example, the balance of the susceptometer with respect to a current through the field coil 12 is about 1 part in 150 and varies by ±−10% from chip-to-chip. As mentioned, part of this imbalance results from asymmetry in the design associated with the opposite sense configuration of pick-up loops 28 and 30. Another part of this imbalance is associated with direct coupling between the wire bonded field coil leads and the pick-up loops 28 and 30. Resistive network 20 is used to electrically adjust this imbalance, utilizing the center tap 48 of the field coil.

As an initial calibration a small tin particle was placed in one pick-up loop and a measurement was made of the μM associated with going through the superconducting transition ($x_m = 0$ to $x_m = -1$). A large number of particles of various sizes and shapes were placed on a horizontal susceptometer chip by running a fine file over a tin sample held above the chip. Using a quartz fiber (tip ~10 μm across) mounted in a micromanipulator, a particle roughly spherical in shape with $2r_o \approx 4.5$–$5.0$ μm was guided into one of the pick-up loops. The particle was lodged partially within a small hole in the passivation and slightly off center in the loop ($X_1 \approx 3$ μm) and $X_2 \approx 4$ μm). All other tin particles in the vicinity of the pick-up loops were swept away with the quartz fiber. The sample, always maintained in a horizontal orientation, was mounted in a cryoinsert and cooled to helium temperatures in a high vacuum with no exchange gas. The particle's superconducting transition was detected at ~3.8° K. as measured with a thermometer on the copper block. The ΔM associated with passing through the transition was −0.10 pH implying ΔM/M = $-9.5 \times 10^{-3}$. From Eqs. (4) and (5) it was predicted ΔM/M = $-1.05 \times 10^{-2} \pm 15\%$, in good agreement. For an applied field of 5 G, $\Delta \phi \approx -0.7 \phi_o$ which is about $10^6$ times greater than the SQUID's white noise in a 1 Hz bandwidth. Thus, the susceptometer is capable of detecting the transition in a similar particle with $2r_o < 1000$Å.

Fabrication

Conventional lithographic techniques are used to form the entire susceptometer chip, including the SQUID and its junctions 24 and 26, the pick-up loops 28 and 30, and the field coil 12, together with the groundplane 34. These techniques are generally well known in the art, as can be seen by referring to the aforementioned technical article by J. H. Greiner et al. In this process, a first metal layer (M1) defining a superconducting groundplane, typically Nb, is deposited over the entire wafer substrate (such as silicon). Using standard photolithography, the opening 32 (FIG. 1) is defined in the groundplane 34, leaving portions of the groundplane to function as the field coil turns 40 and 42. Portions of the groundplane are also etched to allow for pads for contact to the field coil 12, as illustrated by the pad 48 in FIG. 1.

The niobium layer is then anodized to form $Nb_2O_5$ (about 350–700 Å) and a layer of SiO is evaporated to a thickness of about 1500 Å. This provides insulation from subsequent metallization layers, and covers both the unpatterned portions of the groundplane and the portions of the groundplane used for the field coil 12.

The next metallization layer (M2) is an evaporated layer of Pb alloy or Nb. Metallization layer M2 is used to form the base electrodes of the tunnel junctions 24 and 26 in the SQUID 10. Metal layer M2 is also used for interconnections between the tunnel junctions and is made wide in regions outside of the pick-up loops 28 and 30 in order to reduce inductance. A minimum line width is used in the pick-up loops 28 and 30.

To form the tunnel barriers in the junctions 24 and 26, an insulating layer of SiO is deposited and etched away to form openings therein defining the locations of the junctions. The two exposed portions of metallization layer M2 are then oxidized to form a thin insulating layer (~40Å) which functions as a tunnel barrier. After this the top (counter) electrode of the junctions is deposited as metallization level M3. The counter electrode of the junctions 24 and 26 is typically a Pb alloy. A resistor level R1 is also deposited which forms shunting resistors electrically in parallel with the junctions.

After formation of the tunnel junctions, a third layer I3 of insulation is deposited and a fourth level (M4) of metallization is then evaporated to provide interconnections. This fourth level of metallization is usually a Pb alloy. A final layer I4 of insulation is then deposited for passivation.

In the structure, wiring appears on three metallization levels M1, M2 and M4. Level M4 crosses level M2 to provide the opposite sense pick-up loops 28 and 30, and insulation layer I3 provides the necessary electrical insulation in the crossover area. The field coil and on-chip wiring thereto are entirely on the M1 level. In the region outside the groundplane hole in the direction of the field coil contacts, the groundplane consists of M4 metallization which covers the M1 field coil wiring and electrically connects to that portion of the M1 layer which forms the rest of the groundplane.

In the practice of this invention, a miniature, totally integrated susceptometer has been provided on a single chip. The dimensions of all components in the susceptometer are determined by the minimum line width of the lithography that is used to make it, and for this reason can be very small and have the requisite low inductance required for high sensitivity. The pick-up loops are portions of the SQUID loop and are located in the high magnetic field region of the device, in contrast with prior art susceptometers. Additionally, the signal to be measured is generated locally within one of the pick-up loops comprising the SQUID, so there is direct coupling between the sample to be measured and the SQUID loop. The size of the SQUID loop is approximately that of the sample to be measured, and small particles as well as thin films can be examined. While small discrete particles can be measured, thin films can be directly deposited into the pick-up loops where the sizes of the thin films are limited only by the lithography that is used.

It will be appreciated by those of skill in the art that variations can be made to the particular design illustrated herein. For example, the Josephson elements 24 and 26 can be other than planar or edge tunnel junctions, and different metallurgies can be employed. While those of skill in the art can envision many variations, such variations will be within the spirit and scope of the present invention and are intended to be encompassed by the following claims.

What I claim as new and desire to secure by Letters Patent is:

1. A SQUID susceptometer for measuring properties of a very small sample, comprising:
    a dc SQUID including at least two Josephson switching elements in a closed current electrical circuit, said circuit also including pick-up loops located remotely from said Josephson switching elements, said sample to be measured to be placed in one of said pick-up loops,
    a field coil for providing a magnetic field in said pick-up loops, there being at least a single turn of said field coil around each said pick-up loop wherein an electrical current in the turns of said field coil produces a magnetic field in said pick-up loops,
    said dc SQUID and said field coil being comprised of planar thin film structures integrated on a single superconducting chip and wherein a signal due to said sample is coupled directly to said SQUID via said pick-up loop in which said sample is placed and,
    bias means connected to said SQUID for providing electrical currents in said SQUID for adjusting the operating point of said SQUID.

2. The susceptometer of claim 1, where said SQUID pick-up loops are wound in opposite electrical sense.

3. The susceptometer of claim 1, further including a superconducting groundplane, where said SQUID pick-up loops and said field coil turns are located over an opening in said ground plane and said Josephson elements are shielded by said ground plane.

4. The susceptometer of claim 3, further including readout means for detecting the state of said SQUID.

5. The susceptometer of claim 4, where said Josephson elements are nonhysteretic Josephson tunnel junctions.

6. The susceptometer of claim 5, where said SQUID pick-up loops and said tunnel junctions are interconnected by low inductance superconducting transmission lines.

7. The susceptometer of claim 6, where the size of each said SQUID pick-up loop sets the scale for the size of said sample to be measured.

8. The susceptometer of claim 1, further including balance means electrically connected to said field coil to adjust the current therein to a desired value for balancing the susceptometer.

9. The susceptometer of claim 8, where said field coil has a center tap thereto, and said balance means is a resistive network electrically connected to said center tap.

10. A SQUID susceptometer for measuring the properties of a small sample, comprising:
    a single superconducting chip including a superconducting groundplane and having integrated thereon a thin film dc SQUID and a thin film field coil, said dc SQUID including Josephson tunnel junctions and two SQUID pick-up loops wound in opposite electrical sense, said pick-up loops having a size scale approximately that of said sample, said sample being located in one of said pick-up loops during measurement thereof, there being a single turn of said field coil around each one of said SQUID pick-up loops,
    said SQUID pick-up loops and said single turns being located over a hole in said ground plane and remote from said tunnel junctions, said junctions being located over said groundplane for shielding from magnetic fields penetrating said pick-up loops,
    field current means for producing an electrical current through said single turns for coupling to said SQUID pick-up coils, and bias means connected to said SQUID for providing bias electrical currents in said SQUID for adjusting the operating point of said dc SQUID.

11. The susceptometer of claim 10, where said SQUID pick-up loops and said tunnel junctions are interconnected by low inductance superconducting transmission lines.

12. A SQUID susceptometer for measuring the properties of a very small sample, comprising:
a dc SQUID having series wired pick-up loops therein in which said sample can be located and at least two Josephson elements located remote from said pick-up loops and being over a superconducting ground plane,
field coil means including a turn of said field coil means around said SQUID pick-up loops for providing a mangetic field in each of said SQUID pick-up loops,
wherein said dc SQUID and said field coil means are comprises of thin film planar structures integrated on a single chip and have dimensions ultimately limited only by the lithography used to fabricate them,
bias means connected to said dc SQUID for providing electrical currents in said SQUID for adjusting the operating point of said dc SQUID.

13. The susceptometer of claim 12, where the size of said SQUID pick-up loops sets the scale for the size of the sample to be measured.

14. The susceptometer of claim 12, where said Josephson elements are Josephson tunnel junctions.

15. The susceptometer of claim 14, where said Josephson tunnel junctions are nonhysteretic junctions.

16. The susceptometer of claim 12, where said Josephson elements and said SQUID pick-up loops are interconnected by low inductance superconducting transmission lines.

17. The susceptometer of claim 12, further including balance means electrically connected to said field coil means for adjusting said magnetic field to a desired value in each said SQUID pick-up loop.

18. A dc SQUID device capable of measuring the properties of a very small sample, comprising:
a dc SQUID comprised of thin film structures deposited in planar form on a substrate, said SQUID including at least two superconducting switches and a superconducting transmission line connecting said switches to two single-turn SQUID pick-up loops, said superconducting switches being remote from said pick-up loops and shielded from magnetic fields intercepting said pick-up loops,
field coil means for providing a magnetic field intercepting each of said SQUID pick-up loops, said field coil means being comprised of planar thin film structures integrated on the same substrate as said dc SQUID and including a turn surrounding each said pick-up loop, wherein the size of said SQUID pick-up loops sets the scale for the size of said sample to be measured,
balance means electrically connected to said field coil means for adjusting said magnetic field to a desired value in each said SQUID pick-up loop, and
bias means connected to said dc SQUID for providing a bias current to said dc SQUID.

19. The device of claim 18, where said sample to be measured is lithographically deposited within one of said SQUID pick-up loops.

20. The device of claim 18, where said sample has an effective diamater less than 10 $\mu$m.

21. The device of claim 18, where said SQUID pick-up loops have an effective diameter less than 20 $\mu$m.

* * * * *